(12) United States Patent
Kim

(10) Patent No.: US 11,114,786 B2
(45) Date of Patent: Sep. 7, 2021

(54) PCB DIRECT CONNECTOR

(71) Applicant: LG Chem, Ltd., Seoul (KR)

(72) Inventor: Sung-Gyu Kim, Daejeon (KR)

(73) Assignee: LG Chem, Ltd.

( * ) Notice: Subject to any disclaimer, the term of this patent is extended or adjusted under 35 U.S.C. 154(b) by 0 days.

(21) Appl. No.: 16/652,108

(22) PCT Filed: May 9, 2019

(86) PCT No.: PCT/KR2019/005571
§ 371 (c)(1),
(2) Date: Mar. 30, 2020

(87) PCT Pub. No.: WO2019/231129
PCT Pub. Date: Dec. 5, 2019

(65) Prior Publication Data
US 2020/0313324 A1    Oct. 1, 2020

(30) Foreign Application Priority Data

May 31, 2018 (KR) .................. 10-2018-0062820

(51) Int. Cl.
*H01R 12/72* (2011.01)
*H01R 13/436* (2006.01)
(Continued)

(52) U.S. Cl.
CPC ....... *H01R 12/721* (2013.01); *H01R 13/4361* (2013.01); *H01R 13/6272* (2013.01);
(Continued)

(58) Field of Classification Search
CPC .............. H01R 23/7068; H01R 13/432; H01R 13/4362; H01R 13/4361; H01R 13/6272;
(Continued)

(56) References Cited

U.S. PATENT DOCUMENTS 3,047,831 A * 7/1962 Majewski ............ H01R 12/721
439/748
3,601,775 A * 8/1971 Longenecker ....... H01R 12/721
439/636

(Continued)

FOREIGN PATENT DOCUMENTS

CN         1537345 A     10/2004
CN       206259592 U      6/2017
(Continued)

OTHER PUBLICATIONS

International Search Report for PCT/KR2019/005571 dated Aug. 27, 2019; 2 pages.
(Continued)

*Primary Examiner* — Gary F Paumen
(74) *Attorney, Agent, or Firm* — Lerner, David, Littenberg, Krumholz & Mentlik, LLP

(57) ABSTRACT

A PCB direct connector including terminal members configured to have a pair of contact portions elastically contacting an upper surface and a lower surface of the circuit board and be electrically connected to conductive patterns disposed on at least one of the upper surface and the lower surface, and a connector housing configured to accommodate the terminal members therein and allow a connector connection portion formed at one side of an end of the circuit board to be fitted into and released from the connector housing.

13 Claims, 5 Drawing Sheets

(51) Int. Cl.
*H01R 13/627* (2006.01)
*H01R 13/631* (2006.01)
*H05K 1/11* (2006.01)

(52) U.S. Cl.
CPC ........... *H01R 13/631* (2013.01); *H05K 1/117* (2013.01); *H05K 2201/09063* (2013.01); *H05K 2201/09081* (2013.01)

(58) Field of Classification Search
CPC .... H01R 13/631; H01R 12/721; H05K 1/117; H05K 2201/09063; H05K 2201/09081
USPC .......................................... 439/79, 636, 752
See application file for complete search history.

(56) References Cited

U.S. PATENT DOCUMENTS

| | | | | |
|---|---|---|---|---|
| 3,656,093 | A * | 4/1972 | Kinkaid | H01R 12/721 439/872 |
| 3,808,578 | A * | 4/1974 | Hansen | H01R 12/721 439/595 |
| 4,317,609 | A * | 3/1982 | Lapraik | H01R 12/721 439/636 |
| 4,715,824 | A | 12/1987 | Verhoeven | |
| 4,717,218 | A * | 1/1988 | Ratcliff | H01R 12/7005 439/328 |
| 5,013,264 | A * | 5/1991 | Tondreault | H01R 12/721 439/636 |
| 5,238,411 | A * | 8/1993 | Jinno | H01R 12/721 439/59 |
| 5,993,224 | A * | 11/1999 | Quillet | H01R 12/722 439/570 |
| 6,296,531 | B1 | 10/2001 | Nagamine | |
| 6,341,988 | B1 * | 1/2002 | Zhu | H01R 12/721 439/630 |
| 6,994,598 | B2 * | 2/2006 | Holmes | H01R 13/4361 439/752 |
| 7,278,890 | B1 * | 10/2007 | Smutny | H01R 13/4361 439/752 |
| 7,347,738 | B2 * | 3/2008 | Hsieh | H01R 13/4361 439/687 |
| 7,563,134 | B2 * | 7/2009 | Kim | H01R 9/20 439/567 |
| 7,682,205 | B2 * | 3/2010 | Hall | H01R 13/4361 439/752 |
| 8,123,534 | B1 * | 2/2012 | Herring | H01R 12/721 439/79 |
| 8,585,441 | B2 * | 11/2013 | Hsu | H01R 12/725 439/637 |
| 10,396,483 | B2 | 8/2019 | Lee et al. | |
| 2004/0253879 | A1 * | 12/2004 | Correll | H01R 13/428 439/752 |
| 2010/0167570 | A1 | 7/2010 | Yang et al. | |
| 2010/0255694 | A1 | 10/2010 | Kim et al. | |
| 2013/0040505 | A1 | 2/2013 | Hirakawa | |
| 2017/0187139 | A1 | 6/2017 | Dekoski et al. | |
| 2019/0296466 | A1 | 9/2019 | Lappoehn | |
| 2020/0274275 | A1 * | 8/2020 | Kim | H01R 12/58 |

FOREIGN PATENT DOCUMENTS

| | | |
|---|---|---|
| JP | S5498986 A | 8/1979 |
| JP | S62216185 A | 9/1987 |
| JP | H05211082 A | 8/1993 |
| JP | H07312265 A | 11/1995 |
| JP | 2000268902 A | 9/2000 |
| JP | 2006190492 A | 7/2006 |
| JP | 2007214087 A | 8/2007 |
| JP | 201049844 A | 3/2010 |
| JP | 2011146273 A | 7/2011 |
| KR | 20000017090 A | 3/2000 |
| KR | 20070000740 A | 1/2007 |
| KR | 20100110023 A | 10/2010 |
| KR | 20120086735 A | 8/2012 |
| KR | 101292747 B1 | 8/2013 |
| KR | 101400463 B1 | 5/2014 |
| KR | 20170003725 A | 1/2017 |
| KR | 101815456 B1 | 1/2018 |
| WO | 2017194044 A1 | 11/2017 |

OTHER PUBLICATIONS

Extended European Search Report including Written Opinion for Application No. EP19811760.8, dated Nov. 24, 2020, pp. 1-10.
Chinese Search Report for Application No. 201980006721.4, dated Jan. 12, 2021, 8 pages.

* cited by examiner

PCB DIRECT CONNECTOR

CROSS-REFERENCE TO RELATED APPLICATIONS

The present application is a national phase entry under 35 U.S.C. § 371 of International Application No. PCT/KR2019/005571 filed May 9, 2019, published in Korean, which claims priority from Korean Patent Application 10-2018-0062820 filed May 31, 2018, all of which are incorporated herein by reference.

TECHNICAL FIELD

The present disclosure relates to a connector, and more particularly, to a PCB direct connector capable of being directly coupled to a PCB substrate without a complementary connector.

The present application claims priority to Korean Patent Application No. 10-2018-0062820 filed on May 31, 2018 in the Republic of Korea, the disclosures of which are incorporated herein by reference.

BACKGROUND ART

Recently, electronic devices such as laptops, tablet PCs and smart phones as well as BMS used for charging or discharging products using secondary batteries have become increasingly compact and lightweight, and accordingly the density of electronic elements mounted to a circuit substrate thereof is also increasing. Thus, there is a demand for light, thin, short and small connector devices.

As shown in FIG. 1, a conventional connector generally includes a female connector 3 and a male connector 2 in a pair. The female connector 3 has a plurality of pins corresponding to a contact, and the male connector 2 has a plurality of plug terminals that come into contact with the plurality of pins. The male connector 2 is mounted to a circuit board 1 by means of SMT (Surface Mounter Technology), and the female connector 3 is complementarily coupled with the male connector 2.

However, if both the female connector 3 and the male connector 2 are used, different bodies and contacts of the female connector 3 and the male connector 2 should be prepared using different molds, and any one connector must be surface-mounted to a circuit board, which makes the manufacturing process complicated and increases the manufacturing cost.

Thus, there is a growing demand for a connector that may be directly mounted on a circuit board without a complementary connector to reduce component costs of the connector and process costs for the existing Surface Mounting Technology (SMT) process.

Meanwhile, as an example of the connector structure, Korean Unexamined Patent Publication No. 10-2012-0086735 discloses a substrate edge connection-type connector, which may directly connect a terminal to a conductive pattern of a circuit substrate while removing a male connector from the circuit substrate.

The substrate edge connection-type connector is configured to fit into a protruding end (a connection protrusion) of the circuit board. However, in order to use the substrate edge connection-type connector, one end of the circuit board should protrude more than the other, and in this case, the corresponding part may be easily damaged due to external impact. In addition, the substrate edge connection-type connector does not have a holding means, which prevents the connector from being separated from the substrate in a reverse direction after being inserted into the substrate, and is not configured to conveniently assemble and disassemble a plurality of cables in the connector housing.

Thus, there is a need for the development of a new connector, which may be directly mounted on the circuit board, be excellently fixed to the circuit board even against impact and vibration, and allow a plurality of wires and terminals to be easily inserted into and pulled out from the connector housing if necessary.

SUMMARY

Technical Problem

The present disclosure is directed to providing a connector, which may be directly mounted on a circuit board to reduce component costs of the connector and process costs for the existing Surface Mounting Technology (SMT) process.

In addition, the present disclosure is directed to providing a connector, which may be stably fixed to the circuit board even against external impact and vibration to prevent separation or connection fault of the connector and also allow a plurality of components of the connector to be conveniently assembled and disassembled.

Technical Solution

In one aspect of the present disclosure, there is provided a PCB direct connector, which is directly mounted to a circuit board, the PCB direct connector comprising: a plurality of terminal members, each terminal member having a pair of contact portions configured to elastically contact an upper surface and a lower surface of the circuit board, respectively, such that the terminal member is electrically connected to conductive patterns disposed on at least one of the upper surface and the lower surface; and a connector housing configured to accommodate the terminal members therein and to allow a portion of an end of the circuit board to be fitted into and released from the connector housing.

The connector housing may include an upper plate and a lower plate, and front portions of the upper plate and the lower plate may be spaced apart from each other by at least a thickness of the circuit board so that the portion of the end of the circuit board is capable of being inserted therebetween to a predetermined depth, and rear portions of the upper plate and the lower plate may be connected to each other to form a single body.

The rear portions of the upper plate and the lower plate may include insert holes into which the terminal members are adapted to be individually inserted.

The upper plate of the connector housing may include a first part including a first upper plate, a second part including a second upper plate, and a latch positioned between the first upper plate and the second upper plate, and the latch may include a hook configured to be hooked to a fastening hole of the circuit board.

The latch may include a shaft positioned between the first upper plate and the second upper plate and extending in a direction orthogonal to an upper surface of the lower plate located; and a latch plate including the hook and extending in a direction parallel to the upper plate, the latch plate being connected to the shaft to make a seesawing motion based on the shaft.

Each side surface of the connector housing may include a substrate holding rib configured to be fitted into respective end portions of the circuit board.

Each substrate holding rib may be attached to the rear portions of the upper plate and the lower plate, and each substrate holding rib may include an inlet having a width greater than the thickness of the circuit board, and the width of the inlet may gradually decrease in a direction along which an end of the circuit board is inserted.

Each given terminal member may include a terminal body coupled to a signal transmission cable and inserted into a corresponding insert hole at a rear portion of the connector housing, and the pair of contact portions of the given terminal member may be spaced apart from each other by a predetermined gap and respectively extend from the terminal body towards a front portion of the connector housing.

The terminal body may include a horizontal body extending in a direction toward a portion of the terminal body where the signal transmission cable is coupled; and a pair of vertical bodies extending in a common direction and orthogonal to the horizontal body, and the PCB direct connector may further comprise a retainer positioned in a space between the pair of vertical bodies, and the lower plate of the connector housing may include a slot adapted for insertion of the retainer into the rear portion of the connector.

The upper plate of the connector housing may include a first part including a first upper plate, a second part including a second upper plate, and a gap separating the first part and the second part by a predetermined width, and the retainer may include a fastener configured to move through the slot and to be removeably hooked to an upper surface of the lower plate located between the first upper plate and the second upper plate.

The fastener has a trapezoidal shape.

The retainer may further include a terminal support configured to extend at both sides of the housing fastening portion and to be interposed into the space between the pair of vertical bodies.

The connector housing may further include grooves formed in the front portions of the upper plate and the lower plate, respectively, wherein contact portions of the terminal members are adapted to be partially inserted therein, respectively, to maintain a creeping distance between the terminal members.

Advantageous Effects

According to an embodiment of the present disclosure, since the connector may be directly mounted on the circuit board, it is possible to reduce component costs of the connector and process costs for the existing Surface Mounting Technology (SMT) process.

According to another embodiment of the present disclosure, since the connector may be firmly mounted to the circuit board, it is possible to prevent separation or connection fault of the connector with respect to the circuit board even against external impact and vibration.

In addition, components of the connector may be conveniently assembled and disassembled, thereby securing convenient maintenance and management.

It will be clearly understood by those skilled in the art that various embodiments according to the present disclosure can solve various technical problems not mentioned herein.

DETAILED DESCRIPTION

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

In the following description, a circuit board may refer to a BMS circuit board that is applied to a battery pack for a vehicle. Here, the BMS circuit board is a component of the battery pack for controlling the charge/discharge and cell balancing of battery cells. The PCB direct connector 5 of the present disclosure may be used to connect to the BMS circuit board and transmit voltage information or the like of the battery cells to the BMS.

The PCB direct connector 5 of the present disclosure may be used to connect to a printed circuit board of an electronic device such as a laptop, a tablet PC and a smart phone in addition to the BMS circuit board and transmit signals required for the electronic device.

Figure 1:
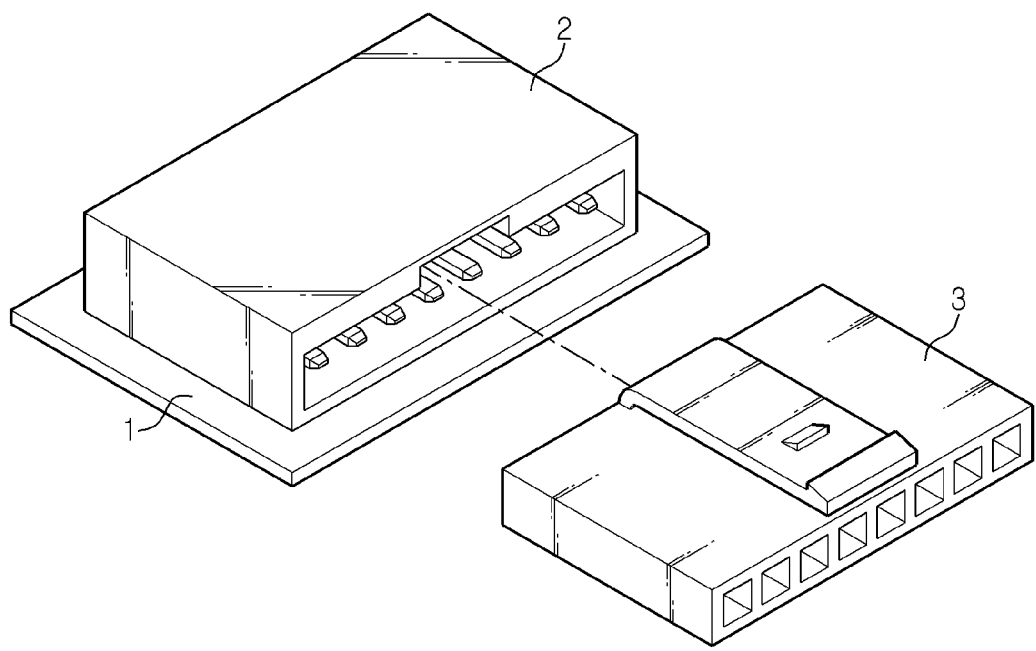
FIG. 1 is a diagram schematically showing conventional male and female connectors.
Figure 2:
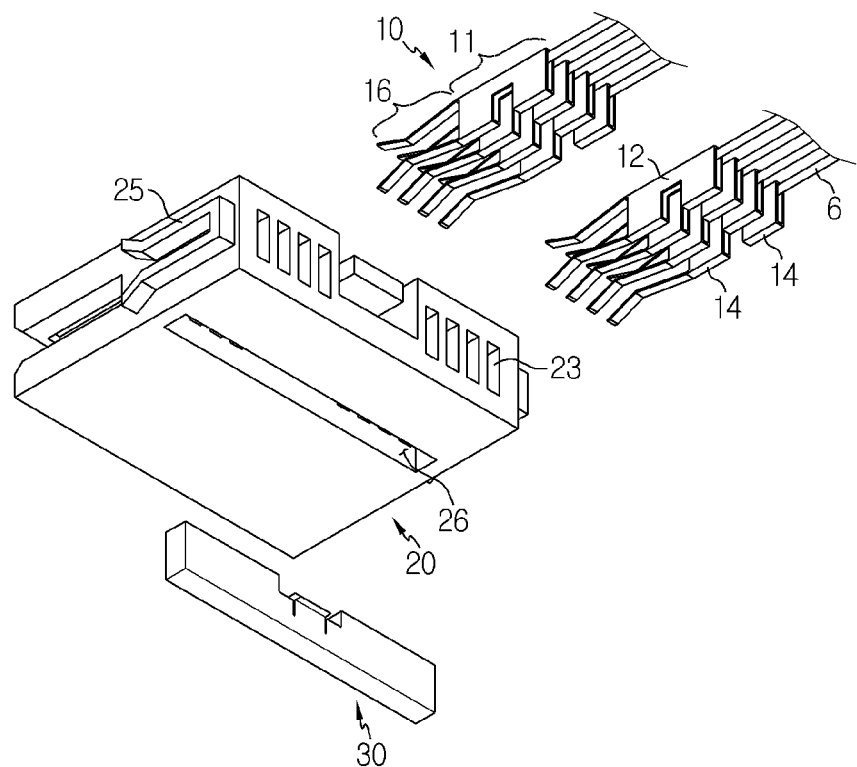
FIG. 2 is an exploded perspective view showing a connector according to an embodiment of the present disclosure.
Figure 3:
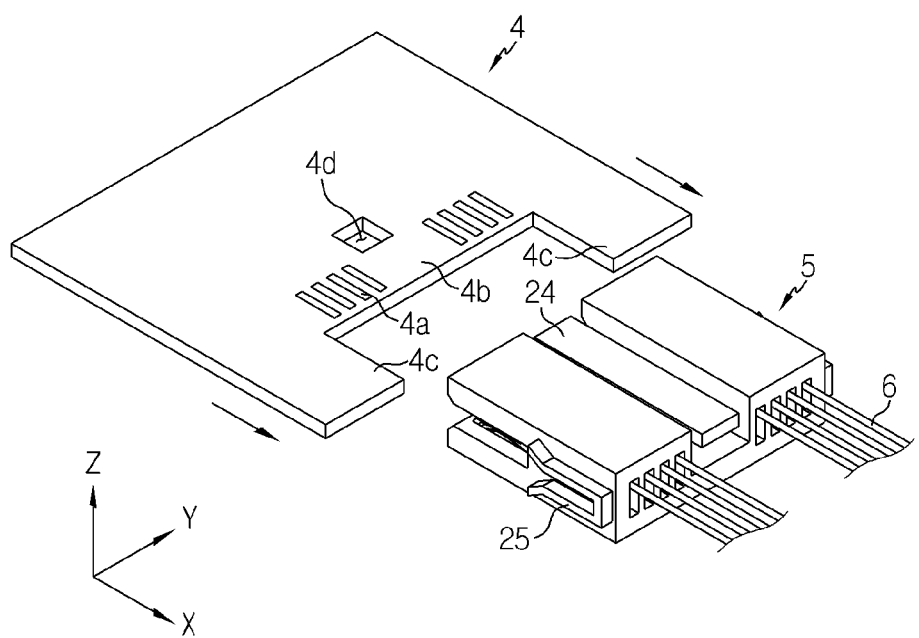
FIGS. 3 and 4 are perspective views showing the connector according to an embodiment of the present disclosure before and after being fastened to a circuit board.
Figure 4:
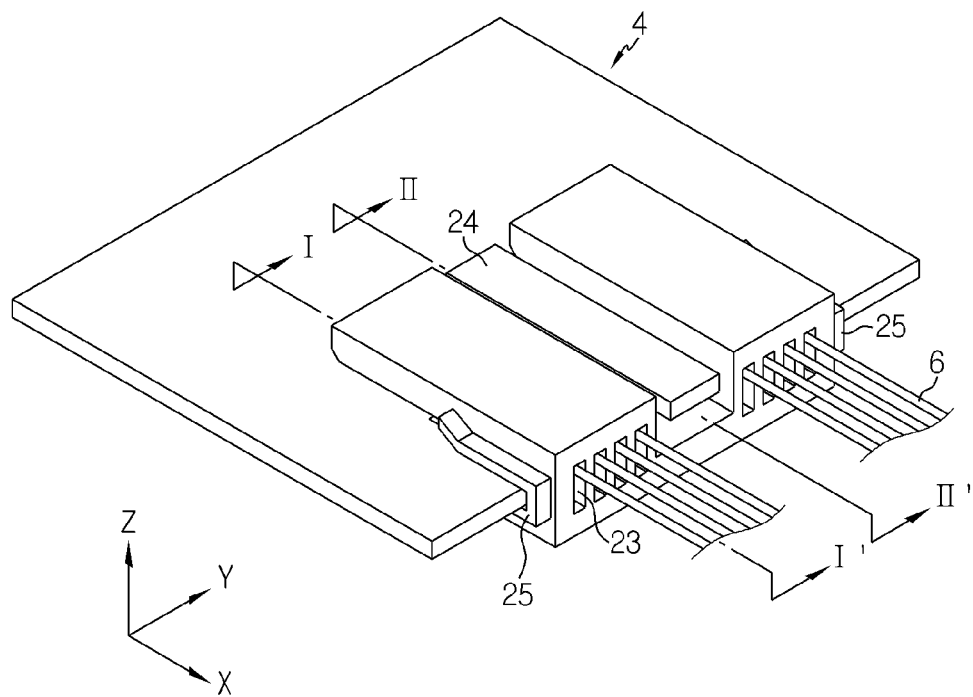

FIG. 2 is an exploded perspective view showing a connector according to an embodiment of the present disclosure, and FIGS. 3 and 4 are perspective views showing the connector according to an embodiment of the present disclosure before and after being fastened to a circuit board.

Referring to the figures, a PCB direct connector according to an embodiment of the present disclosure is connected directly to a circuit board without a male connector, unlike an existing method where a female connector is inserted into a male connector of a circuit board for the connection to the circuit board. In this case, the production cost of the male connector and the process cost of mounting the male connector to the circuit board may be reduced.

Seeing components of the PCB direct connector 5 according to an embodiment of the present disclosure, as shown in FIG. 2, the PCB direct connector 5 includes terminal members 10, a connector housing 20 and a retainer 30.

The terminal members 10 are electrically conductive metallic components used to easily connect signal transmission cables 6 to conductive patterns 4a of a circuit board 4 and include a terminal body 11 and a pair of contact portions 16.

The terminal body 11 is a component that clamps one end of the signal transmission cable 6 and is inserted into the connector housing 20. The signal transmission cable 6 may be connected into the terminal body 11, for example in a press-fit manner. In addition, the pair of contact portions 16 may be integrally formed with the terminal body 11 and contact the conductive pattern 4a of the circuit board 4.

The terminal body 11 of this embodiment includes a horizontal body 12 extending toward a portion where the signal transmission cable 6 is connected, and a pair of vertical bodies 14 extending in the same direction orthogonal to the horizontal body 12 with a predetermined gap therebetween.

For example, as shown in FIG. 2, the terminal body 11 may be provided to have a '⊂' shape. The signal transmission cable 6 may be connected to the horizontal body 12, and the retainer 30 may be interposed later in a space formed between the pair of vertical bodies 14. The retainer 30 may prevent the terminal member 10 from leaving from the inside of the connector housing 20.

The pair of contact portions 16 may be spaced apart from each other with a predetermined gap therebetween and respectively extend from the terminal body 11, and at least a portion of the pair of contact portions 16 may have a cantilever shape curved to face each other.

The pair of contact portions 16 may contact a conductive pattern 4a provided on at least one of an upper surface and a lower surface of the circuit board 4 when the direct connector 5 is mounted to the circuit board 4. At this time, the distance between the curved portions facing each other at the two contact portions 16 may be narrower than the thickness of the circuit board 4 such that the corresponding portion is elastically in contact with the upper surface and the lower surface of the circuit board 4.

Meanwhile, the direct connector 5 according to the present disclosure may be fastened to the circuit board 4 without a male connector. However, as shown in FIG. 3, the direct connector 5 may be applied to a circuit board 4 in which a predetermined fastening hole 4d and conductive patterns 4a are provided in advance. Hereinafter, one side of an end of the circuit board 4 having the conductive patterns 4a will be referred to as a connector connection portion 4b. The connector connection portion 4b is preferably formed concave into the circuit board 4 rather than the other end.

The connector housing 20 accommodates the terminal members 10 therein and is provided so that the connector connection portion 4b of the circuit board 4 may be fitted into and released from the connector housing 20. In other words, the connector housing 20 and the connector housing portion 4b of the circuit board 4 are provided to be coupled to and released from each other in a slot manner.

Referring to FIGS. 3 to 9, the connector housing 20 includes an upper plate 21 and a lower plate 22, which form an accommodation space of the terminal members 10, and a latch 24 and a substrate holding rib 25, which form a locking means for the circuit board 4.

The upper plate 21 and the lower plate 22 may be regarded as a part forming a body of the connector housing 20.

The upper plate 21 and the lower plate 22 are spaced apart from each other as much as at least the thickness of the circuit board 4 so that the connector connection portion 4b is inserted therebetween to a predetermined depth, and rear portions 20b of the upper plate 21 and the lower plate 22 are connected to each other to form a single body. In the rear portions 20b of the upper plate 21 and the lower plate 22, insert holes 23 for individually inserting the terminal members 10 are formed.

Terminal members 10 may be inserted through the insert holes 23 to the front portion 20a of the connector housing behind the connector housing 20. At this time, the terminal body 11 is inserted into the insert hole 23 and disposed at the rear portion 20b of the connector housing 20, and the pair of contact portions 16 are disposed at the front portion 20a of the connector housing 20.

Since the rear portion 20b of the connector housing 20 is blocked, the connector connection portion 4b may be inserted up to the front portion 20a of the connector housing 20. The upper surface and the lower surface of the connector connection portion 4b are elastically supported by the pair of contact portions 16a, 16b.

Guide grooves may be provided at the upper plate 21 and the lower plate 22 of the front portion 20a of the connector housing 20 to secure a creeping distance between neighboring terminal members 10. The contact portions 16a, 16b of different terminal members 10 neighboring in the Y-axis direction (see FIG. 7) are partially inserted into the guide grooves, respectively, to keep the creeping distance constantly, thereby preventing a short circuit therebetween.

The latch 24 is hooked to the fastening hole 4d provided in the circuit board 4 in advance to hold the connector housing 20 not to be released from the connector connection portion 4b in a reverse direction (+X-axis direction).

In this embodiment, the upper plate 21 of the connector housing 20 is divided into a first upper plate 21a and a second upper plate 21b, and the latch 24 is provided between the first upper plate 21a and the second upper plate 21b.

Figure 9:
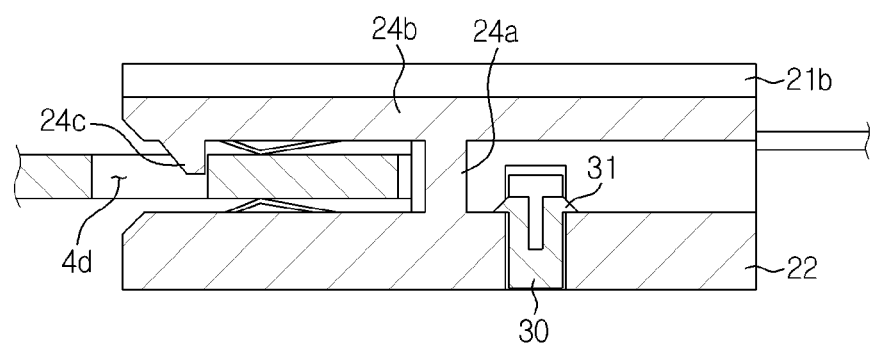
FIG. 9 is a cross-sectioned view, taken along the line II-II' of FIG. 4.
Figure 10:
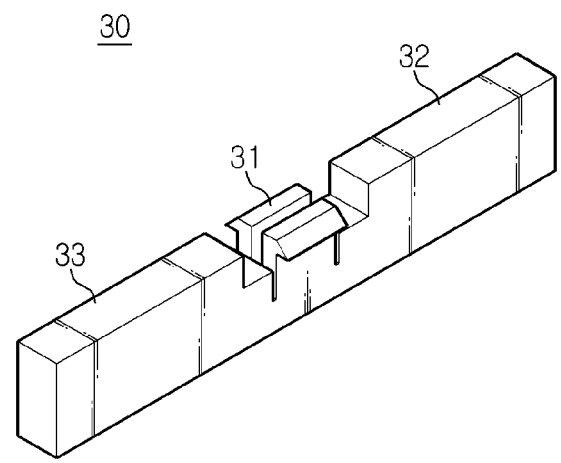
FIG. 10 is a perspective view showing a retainer of FIG. 9.

Referring to FIG. 4 along with FIG. 9, the latch 24 includes a shaft 24a protruding orthogonal to the upper surface of the lower plate 22, a latch plate 24b connected to the shaft 24a and extending parallel to the upper plate 21, and a hook 24c provided at one end of the latch plate 24b. The hook 24c may be vertically inserted into the fastening hole 4d provided at the circuit board 4 and be bent orthogonal to the latch plate 24b so as to be hooked in the fastening hole 4d.

The latch plate 24b is supported by the shaft 24a at a predetermined gap away from the lower plate 22, and the shaft 24a is located approximately at the center of the latch plate 24b. The latch plate 24b may make a seesawing operation based on the shaft 24a. If the latch 24 is used, when it is intended to remove the connector housing 20 from the circuit board 4, a user may simply press the other end of the latch plate 24b to release the hooking between the hook 24c and the fastening hole 4d and then pull the connector housing 20 in the reverse direction.

The substrate holding rib 25 holds the connector housing 20 not to move in the upper, lower, left and right directions (±Y-axis and ±Z-axis directions) relative to the circuit board 4. Here, it is assumed that the circuit board 4 is configured such that the substrate holding rib 25 may be applied thereto. That is, the circuit board 4 is assumed such that the connector connection portion 4b has a width corresponding to the upper plate 21 and the lower plate 22 of the connector housing 20 and is concavely recessed into the circuit board 4.

Figure 5:
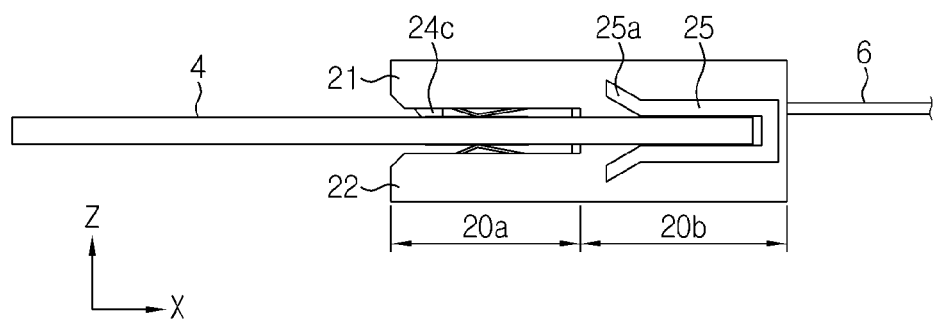
FIG. 5 is a side view of FIG. 4.
Figure 6:
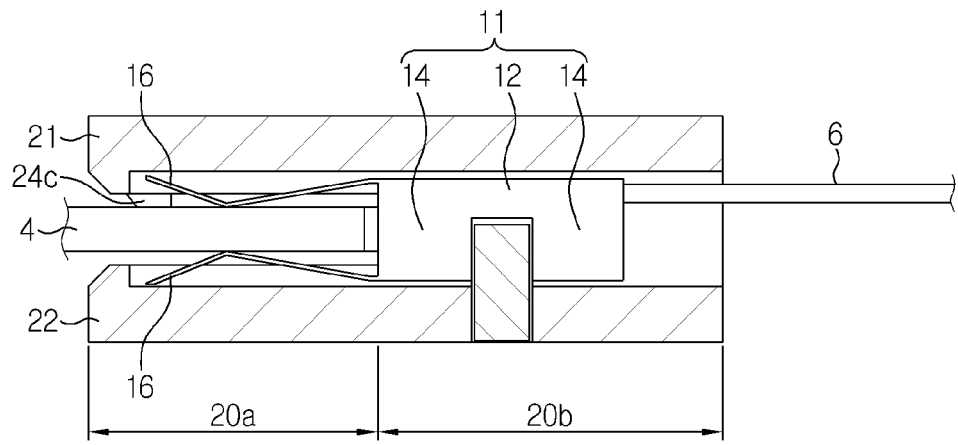
FIG. 6 is a cross-sectioned view, taken along the line I-I' of FIG. 4.
Figure 7:
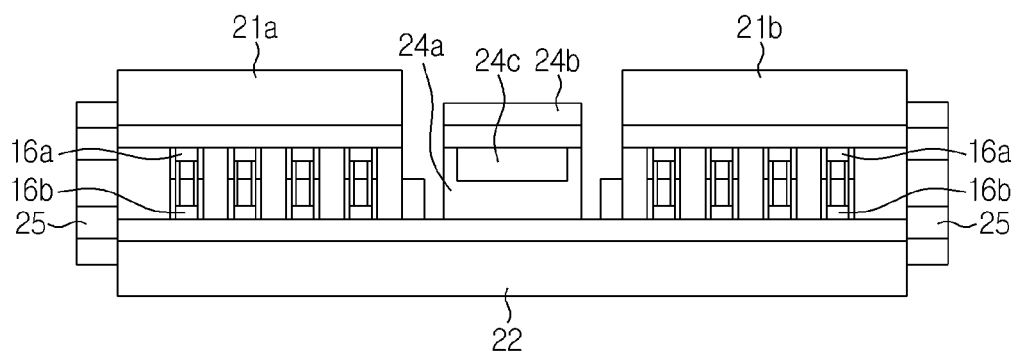
FIG. 7 is a front view showing the connector according to an embodiment of the present disclosure.
Figure 8:
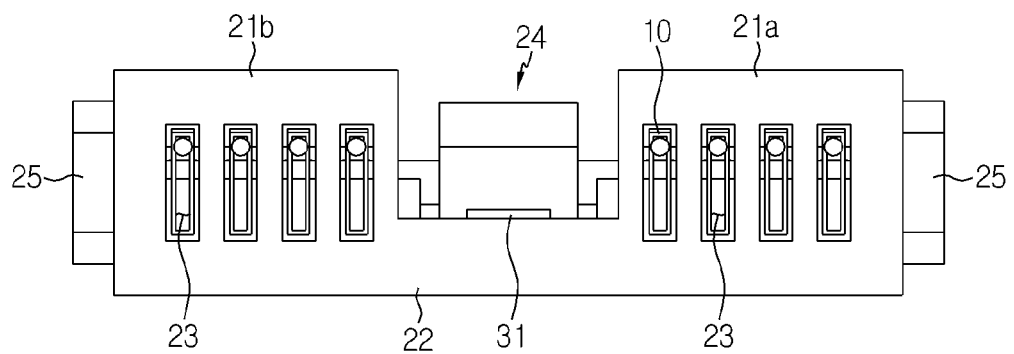
FIG. 8 is a rear view showing the connector according to an embodiment of the present disclosure.

As shown in FIG. 5, the substrate holding ribs 25 according to this embodiment are located at both side surfaces of the connector housing 20 and have an inner width corresponding to the thickness of the circuit board 4 such that the end portions of the circuit board 4 adjacent to both sides of the connector connection portion 4b are fitted therein. Here, the end portion of the circuit board 4 will be referred to as a rib connection portion 4c.

When the front portion 20a of the connector housing 20 is pushed into the connector connection portion 4b of the circuit board 4, the rib connection portions 4c are fitted into the substrate holding ribs 25, and the connector housing 20 is tightly fixed to the circuit board 4.

In particular, the substrate holding ribs 25 may be provided at the rear portion of the connector housing 20, namely at the rear portions of the upper plate 21 and the lower plate 22 whose side surfaces are blocked. In this case, when the connector housing 20 is fully pushed into the connector connection portion 4b, the rear portion 20b of the connector housing 20 is tightly interposed in the space between the rib connection portions 4c so that both side surfaces thereof are supported in the left and right direction by the rib connection portion 4c. Thus, the connector housing 20 may be fixed not to move in the left and right direction (±Y-axis direction) with respect to the circuit board 4 even if there is vibration or impact.

In addition, the substrate holding ribs 25 have an inlet having a width greater than the thickness of the circuit board 4. The inlet 25a may have a width gradually decreasing in a direction along which the end of the circuit board 4 is inserted. If the inlet 25a of the substrate holding rib is provided as above, the inlet 25a of the substrate holding rib having a greater width may be easily matched with the front end of the rib connection portion 4c. In addition, even if the front end of the rib connection portion 4c is slightly misaligned from the center of the inlet 25a of the substrate holding rib while being fitted, since the width of the inlet 25a gradually decreases, the rib connection portion 4c may be guided suitable for the inner width of the substrate holding rib 25. Thus, the connector 5 may be aligned in position to be fastened to the circuit board 4.

Meanwhile, the direct connector 5 according to an embodiment of the present disclosure is a connector for connecting to the BMS circuit board 4 applied to a battery pack for a vehicle, and further includes a retainer 30 for holding the terminal members 10 not to move.

Referring to FIGS. 2, 6, 8 to 10 together, the retainer 30 may be inserted into the terminal body 11 disposed in the insert hole 23 of the rear portion 20b of the connector housing 20, namely into the space formed between the horizontal body 12 and the pair of vertical bodies 14.

For this purpose, a slot is further formed in the lower plate 22 of the connector housing 20 in a direction intersecting with the insert hole 23. The retainer 30 is inserted perpendicularly to the rear portion 20b of the connector housing 20 through the slot formed in the lower plate 22 of the connector housing 20 and interposed in the fitting space formed between the pair of vertical bodies 14. In other words, one retainer 30 is inserted upward from the bottom of the lower plate 22 of the connector housing 20 and is interposed in the fitting space of all terminal members 10. Thus, all terminal members 10 may be prevented from moving in the ±X-axis direction.

Seeing the retainer 30 of this embodiment more closely, the retainer 30 includes terminal supports 32, 33 and a housing fastening portion 31. The terminal supports 32, 33 are interposed in the fitting space of the terminal body. The housing fastening portion 31 is provided between the terminal supports 32, 33 to fix the retainer 30 to the connector housing 20.

As described above, the upper plate 21 of the connector housing 20 of this embodiment is divided into the first upper plate 21a and the second upper plate 21b, and the latch plate 24b is spaced apart from the lower plate 22 in the vertical direction (Z-axis direction) by a predetermined gap between the first upper plate 21a and the second upper plate 21b. As described above, the retainer 30 may be configured to be fixed to the connector housing 20 by utilizing the space at the upper surface of the lower plate 22 which is spaced apart from the latch plate 24b by a predetermined gap.

For example, the housing fastening portion 31 of the retainer 30 is provided to move through the slot of the lower plate 22 and be hooked to and unhooked from the upper surface of the lower plate 22 located between the first upper plate 21a and the second upper plate 21b. That is, as shown in FIG. 9, the housing fastening portion 31 has a bi-pyramid brace shape or a trapezoidal shape so that retainer 30 is hooked to the upper surface of the lower plate 22 not to be easily released from the connector housing 20. Also, if the gap between the hooks is narrowed than the width of the slot by using a tool, the retainer 30 may be unhooked from the upper surface of the lower plate 22 and be released from the connector housing 20.

If the retainer 30 is used, the terminal members 10 in the connector housing 20 may be integrally supported in all of upper, lower, left, right, front and back directions, thereby preventing a defective contact between the terminal members 10 and the conductive pattern 4a even under vibration and shock conditions. In addition, on the contrary, if the retainer 30 is separated from connector housing 20, the terminal members 10 may be easily released from the connector housing 20, thereby ensuring convenient maintenance and management of the connector when necessary.

If the configuration of the PCB direct connector 5 according to an embodiment of the present disclosure as described above is used, it is possible to simplify the structure and manufacturing process of the connector and reduce the manufacturing cost thereof, compared to the existing male and female pair of connectors, and the PCB direct connector 5 may be robustly mounted to the circuit board 4, thereby preventing the connector from being detached or badly contacted even in an environment where vibration or shock is applied.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Meanwhile, when the terms indicating up, down, left and right directions are used in the specification, it is obvious to those skilled in the art that these merely represent relative locations for convenience in explanation and may vary based on a location of an observer or an object to be observed.

What is claimed is:

1. A printed circuit board (PCB) direct connector, wherein the PCB direct connector is directly mounted to a circuit board, the PCB direct connector comprising:
  a plurality of terminal members, each terminal member having a pair of contact portions configured to elastically contact an upper surface and a lower surface of the circuit board, respectively, such that the terminal member is electrically connected to conductive patterns disposed on at least one of the upper surface and the lower surface; and a connector housing configured to accommodate the terminal members therein and to allow a portion of an end of the circuit board to be fitted into and released from the connector housing wherein the connector housing includes:
a lower plate; and
a first upper plate;
a second upper plate, wherein front portions of the first and second upper plates are spaced apart from the lower plate by at least a thickness of the circuit board so that the portion of the end of the circuit board is capable of being inserted between the lower plate and the first and second upper plates to a predetermined depth; and
a latch positioned on an upper surface of the lower plate and between the first upper plate and the second upper plate.

2. The PCB direct connector according to claim 1,
wherein rear portions of the upper plate and the lower plate are connected to each other to form a single body.

3. The PCB direct connector according to claim 2,
wherein the rear portions of the upper plate and the lower plate include insert holes into which the terminal members are adapted to be individually inserted.

4. The PCB direct connector according to claim 1,
wherein the latch includes:
a latch plate extending in a direction parallel to the upper plate; and
a hook extending downward from an end of the latch plate and configured to be hooked to a fastening hole of the circuit board.

5. The PCB direct connector according to claim 4,
wherein the latch further includes
a shaft positioned between the first upper plate and the second upper plate and extending in a direction orthogonal to an upper surface of the lower plate, wherein the latch plate is connected to the shaft to make a seesawing motion based on the shaft.

6. The PCB direct connector according to claim 1,
wherein each side surface of the connector housing includes a substrate holding rib configured to be fitted into respective end portions of the circuit board.

7. The PCB direct connector according to claim 6,
wherein each substrate holding rib is attached to the rear portions of the first and second upper plates and the lower plate, and
wherein each substrate holding rib includes an inlet having a width greater than the thickness of the circuit board, and
wherein the width of the inlet gradually decreases in a direction along which an end of the circuit board is inserted.

8. The PCB direct connector according to claim 3,
wherein each given terminal member includes a terminal body coupled to a signal transmission cable and inserted into a corresponding insert hole at a rear portion of the connector housing, and
wherein the pair of contact portions of the given terminal member are spaced apart from each other by a predetermined gap and respectively extend from the terminal body towards a front portion of the connector housing.

9. The PCB direct connector according to claim 8,
wherein the terminal body includes:
a horizontal body extending in a direction toward a portion of the terminal body where the signal transmission cable is coupled; and
a pair of vertical bodies extending in a common direction and orthogonal to the horizontal body,
wherein the PCB direct connector further comprises a retainer positioned in a space between the pair of vertical bodies, wherein the lower plate of the connector housing includes a slot adapted for insertion of the retainer into the rear portion of the connector.

10. The PCB direct connector according to claim 9,
wherein the upper plate of the connector housing includes a first part including a first upper plate, a second part including a second upper plate, and a gap separating the first part and the second part by a predetermined width, and
wherein the retainer includes a fastener configured to move through the slot and to be removeably hooked to an upper surface of the lower plate located between the first upper plate and the second upper plate.

11. The PCB direct connector according to claim 10,
wherein the fastener has a trapezoidal shape.

12. The PCB direct connector according to claim 9,
wherein the retainer further includes a terminal support configured to extend at both sides of the housing fastening portion and to be interposed into the space between the pair of vertical bodies.

13. The PCB direct connector according to claim 2,
wherein the connector housing further includes guide grooves formed in the front portions of the first and second upper plates and the lower plate, respectively, wherein contact portions of the terminal members are adapted to be partially inserted therein, respectively, to maintain a creeping distance between the terminal members.

\* \* \* \* \*